_United States Patent_ [19]

Gulczynski

[11] Patent Number: 5,155,489
[45] Date of Patent: Oct. 13, 1992

[54] SEGMENTED ENCODER AND DIGITAL MEMORY PARTICULARLY FOR FLASH ANALOG-TO-DIGITAL CONVERTERS

[76] Inventor: Zdzislaw Gulczynski, P.O. Box 11633, Costa Mesa, Calif. 92627

[21] Appl. No.: 304,506

[22] Filed: Jan. 31, 1989

[51] Int. Cl.$^5$ .............................................. H03M 1/34
[52] U.S. Cl. .................... 341/160; 341/155; 341/106
[58] Field of Search .............. 341/81, 82, 83, 99, 341/158, 159, 160, 141, 155, 106; 307/463, 518; 328/119

[56] References Cited

U.S. PATENT DOCUMENTS

| | | | |
|---|---|---|---|
| 4,143,366 | 3/1979 | Lewis, Jr. | 341/160 |
| 4,211,999 | 7/1980 | Clark et al. | 341/160 |
| 4,417,233 | 11/1983 | Inoue et al. | 341/159 |
| 4,586,025 | 4/1986 | Knierim | 341/160 |
| 4,635,036 | 1/1987 | Yoshizawa | 341/159 |

_Primary Examiner_—William M. Shoop, Jr.
_Assistant Examiner_—H. L. Williams

[57] ABSTRACT

The encoder is particularly for ultra fast high resolution flash analog-to-digital converters. A simple multiplexing is performed. An optional buffer memory stores selected codes prior to a final processing which can be relatively slow. An input register is unnecessary. The input code is divided into a least significant section code and at least one more significant section code each having a least significant bit. A multiplexer selects the least significant section code or a portion of one of the more significant section codes excluding the least significant bit thereof, in response to the least significant bits. The multiplexer includes a plurality of buffers for separately receiving the section codes and having outputs coupled in parallel. A decoder converts the least significant bits and selected code into the binary output code.

20 Claims, 3 Drawing Sheets

SEGMENTED ENCODER AND DIGITAL MEMORY PARTICULARLY FOR FLASH ANALOG-TO-DIGITAL CONVERTERS

This invention is related to the following inventions by the same inventor:

"Ultra Fast Logic with Temperature Compensation and Minimized Supply Voltage" Ser. No. 474,489 filed Feb. 2, 1990:

"Dual Flash Analog-to-Digital Converter" Ser. No. 316,592 filed Feb. 24, 1989;

"Dual Flash Analog-to-Digital Converter" Ser. No. 316,593 filed Feb. 24, 1989;

"Dual Flash Analog-to-Digital Converter" Ser. No. 316,594 filed Feb. 24, 1989;

"Ladderless True Flash Analog-to-Digital Converter with Automatic Calibration" Ser. No. 304,505 filed herewith;

"Ultra Fast Digital-to-Analog Converter with Independent Bit Current Source Calibration" filed herewith, now U.S. Pat. No. 4,958,155 dated Sep. 18, 1990;

"High Power Switching Power Supply with High Power Factor" Ser. No. 304,508 filed herewith;

"High Power Switching Power Supply Having High Power Factor" filed herewith, now U.S. Pat. No. 4,956,760 dated Sep. 11, 1990;

"High Accuracy Reference Ladder" filed herewith, now U.S. Pat. No. 4,929,848 dated May 29, 1990;

"High Speed Integrating Analog-to-Digital Converter" filed herewith, now U.S. Pat. No. 4,940,982 dated Jul. 10, 1990;

"Flash Analog-to-Digital Converter with Integrating Input Stage" Ser. No. 248,495 filed Sep. 22, 1988;

"Encoder with Error Correction Particularly for Flash Analog-to-Digital Converters" Ser. No. 225,240 filed Jul. 28, 1988;

"Sample-and-Hold Amplifier with Controllable Source Charger" U.S. Pat. No. 4,980,686 dated Dec. 25, 1990;

"High Speed Integrating Digital-to-Analog Converter" Ser. No. 441,391 filed May 23, 1988;

"Ultra Fast Logic" U.S. Pat. No. 4,943,740 dated Jul. 24, 1990; "High Speed Instrumentation Amplifier with Minimized Offset Voltage and Drift" U.S. Pat. No. 4,829,263 dated May 9, 1989; "Digital-to-Analog Converter with Digital Correction" U.S. Pat. No. 4,843,392 dated Jun. 27, 1989;

"Flash Analog-to-Digital Converter" U.S. Pat. No. 4,763,106 dated Aug. 9, 1988;

"Dual Flash Analog-to-Digital Converter" U.S. Pat. No. 4,857,931 dated Aug. 15, 1989;

"Digital-to-Analog Converter" U.S. Pat. No. 4,811,017 dated Mar. 7, 1989;

"Digital-to-Analog Converter" U.S. Pat. No. 4,837,572 dated Jun. 6, 1989; and

"Operational Amplifier or Comparator Circuit with Minimized Offset Voltage and Drift" U.S. Pat. No. 4,749,953 dated Jun. 7, 1988.

This invention is also related to:

"Converter for Converting a High Frequency Video Signal to a Digital Signal" U.S. Pat. No. 4,211,999 dated Jul. 8, 1980 by Clark et al.

BACKGROUND OF THE INVENTION

The invention relates to an encoder particularly for ultra fast high resolution flash analog-to-digital converters (ADC).

Two parts can be distinguished in every flash ADC: an analog and digital sections. The analog section of conventional N-bit flash ADCs consists of a reference source, chain of $2^N - 1$ resistors and the same number of comparators. The digital section consists of an encoder for sampling comparator output signals, correcting faulty codes and providing binary output code.

The digital output code from the analog section of a flash ADC provided by comparators is referred to as thermometer code since only one pair of adjacent bits is 0 and 1. The code must be sampled and stored as it is unstable due to changes of the ADC input signal, offset voltage drift of comparators, noise, etc.

An encoder is disclosed by Clark et al. in the abovementioned "Converter for Converting a High Frequency Video Signal to a Digital Signal" U.S. Pat. No. 4,211,999 dated Jul. 8, 1980. The thermometer code is stored in an input register which also provides a pair of section codes. Priority encoders convert the section codes into binary codes. One of the binary codes is selected by a multiplexer in response to a select bit provided from one of the priority encoders. The multiplexer provides the output code of the encoder. The priority encoders separately convert the section codes and binary codes are separately applied to the multiplexer. This results in a very complex structure at a high resolution of the flash ADC. Moreover, the employment of the priority encoders prior to the multiplexer results in large propagation delays, different for different binary codes. The input register is necessary. A very limited error correction is accomplished.

The huge number of the comparators in high resolution flash ADCs results in a very complex gate structure of the encoders. Certain kinds of errors caused by a false response of the comparators are not possible to correct thru a digital correction in the encoder, wherein a final error is large. For instance, the flash ADCs have a tendency to miss a code every few billion conversions, i.e. several times a minute when ADC is sampling at 100 MHz.

Recently invented conversion schemes result in significantly increased speed and resolution of the flash ADCs. Moreover, a possibility of anomalous response of the comparators is significantly reduced. A number of documents addresses these problems and in particular the abovementioned "High Resolution True Flash Analog-to-Digital Converter", "High Accuracy Reference Ladder", both filed on even date herewith and "Flash Analog-to-Digital Converter" U.S. Pat. No. 4,763,106 dated Aug. 9, 1988. All inventions are by the same inventor.

SUMMARY OF THE INVENTION

The invention is intended to provide an encoder for ultra fast high resolution flash ADCs. A simple multiplexing is performed. An optional buffer memory stores selected codes prior to a final processing, whereby the input register is unnecessary. With reference to prior art, the number of components is reduced, error correction scheme extended and conversion speed drastically increased.

The encoder according to the invention converts input code into output code and comprises a means for dividing the input code into a least significant section, code and at least one more significant section code each having a least significant bit, a means for providing a first portion of the output code in response to the least significant bits, a multiplexer means for selecting one section code or a portion thereof excluding the respective least significant bit, in response to the least significant bits, and an offset decoder means for converting the selected code into a second portion of the output code.

In another embodiment the encoder comprises a means for dividing the input code into a least significant section code, and a plurality of more significant section codes each having a least significant bit, a multiplexer means for selecting the least significant section code or a portion of one of the more significant section codes excluding the least significant bit thereof, in response to the least significant bits, and a decoder means for converting the least significant bits and selected code into the output code.

In yet another embodiment the encoder includes a memory means for interim storage of a plurality of the least significant bits and a plurality of the selected codes.

BRIEF DESCRIPTION OF THE DRAWINGS

The present invention will become more clear in conjunction with the accompanying figures throughout which similar references denote similar parts and of which.

DETAILED DESCRIPTION OF THE INVENTION

Figure 1:
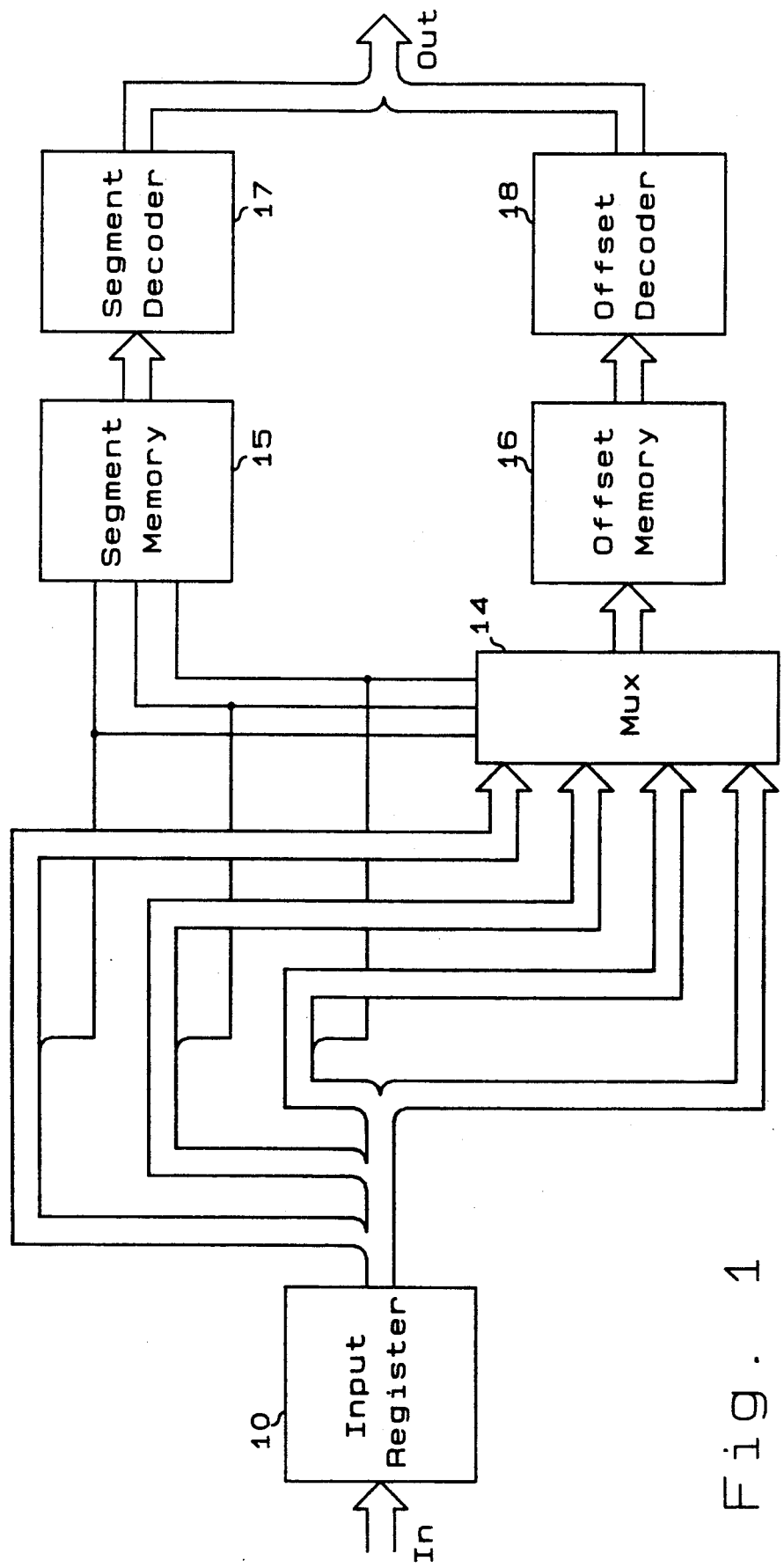
FIG. 1 is an embodiment of the encoder with the input register and buffer memory, processing four section codes.

FIG. 1 is an embodiment of the encoder processing a plurality of section codes, wherein four section codes are considered for simplicity. Each section code is a group of bits adjacent to bits of another section code. Specifically, the encoder input code is divided into most and least significant bits (MSBs and LSBs respectively). The LSBs constitute one section code while the MSBs are divided into three other section codes, as shown in FIG. 1. The connections carrying one bit and plurality of bits are marked as single lines and data buses respectively. Generally, the encoder comprises a means for dividing the input code into a least significant section, code and at least one more significant section code each having an LSB. The means for dividing includes the optional input register 10 for interim storage of the input code. The register 10 also samples the input code and provides the section codes, wherein latches or edge triggered flip-flops can be employed.

The multiplexer 14 selects one section code or a portion thereof excluding the respective LSB, in response to the LSBs of the more significant section codes. Specifically, the section code comprising the LSBs of the input code is applied to the multiplexer 14. However, the more significant section codes, i.e. originating from the MSBs of the input code, each have one LSB. These LSBs control the multiplexer 14 and therefore are already considered. The portions of the more significant section codes applied to the multiplexer 14 exclude the respective LSBs.

The three LSBs of the more significant section codes are applied to the segment memory 15. The code selected by the multiplexer 14 is applied to the offset memory 16. The memories 15 and 16 constitute a buffer memory for interim storage of a plurality of the LSBs and a plurality of the selected codes. Fast memory devices are employed in the buffer memory. A shift register is recommended, e.g. first-in first-out (FIFO).

The codes stored in memories 15 and 16 are successively retrieved and converted into the output code of the encoder. Specifically, the segment decoder 17 converts the LSBs of the more significant section codes into a first portion of the output code. The offset decoder 18 converts the selected codes into a second portion of the output code.

Figure 2:
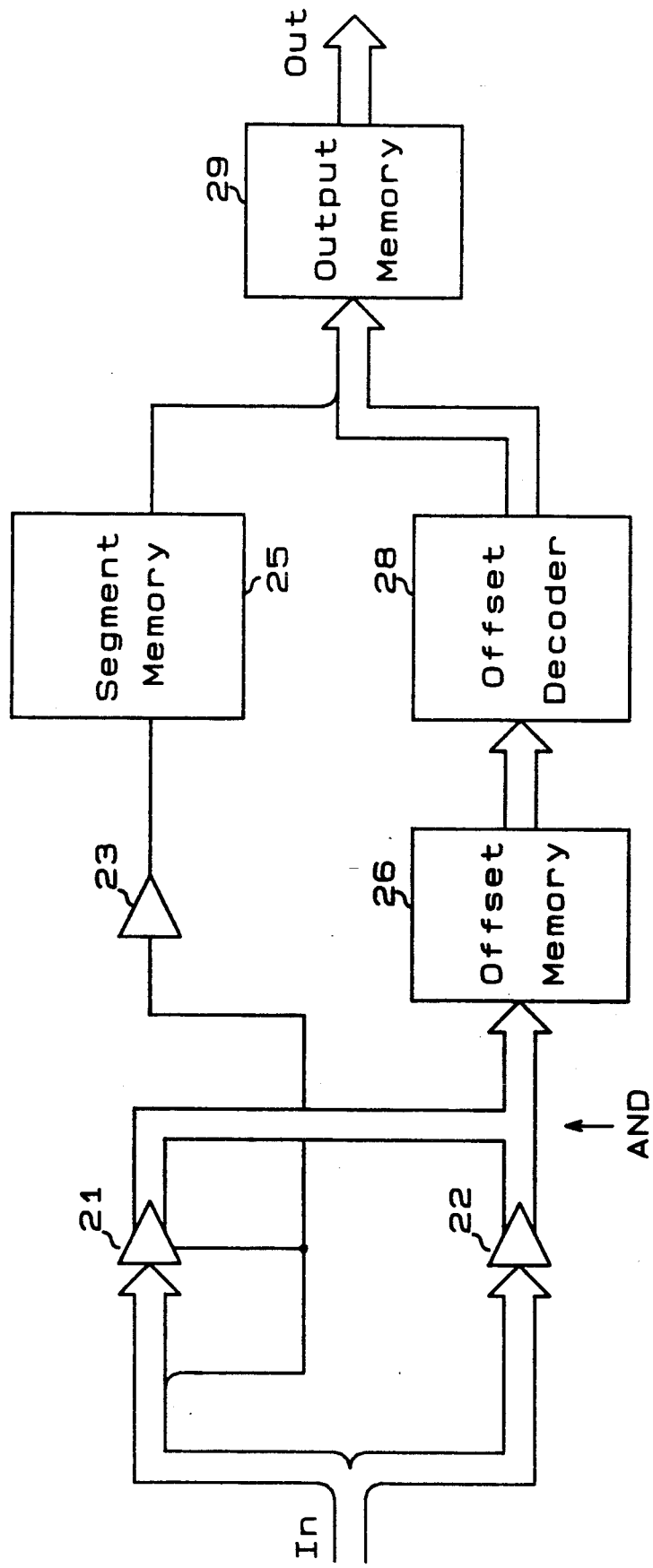
FIG. 2 is an embodiment of the encoder with buffer memory and output memory, and with multiplexer having the preferred structure.

FIG. 2 is an embodiment of the encoder with buffer memory and output memory, and with multiplexer having the preferred structure. The encoder input code is divided into MSBs and LSBs which constitute section codes. Moreover, the MSBs have an LSB. A means for providing a first portion of the output code is responsive to the LSB. A multiplexer selects the LSBs or a portion of the MSBs excluding the respective LSB, in response thereto. The offset decoder 28 converts the selected code into a second portion of the output code.

The LSB of the MSBs and code selected by the multiplexer are applied to segment memory 25 and offset memory 26 respectively. The memories 25 and 26 constitute a buffer memory for interim storage of a plurality of the LSBs of the MSBs and a plurality of the selected codes. The means for providing includes the buffer 23 coupled in series with the LSB of the MSBs for compensating for a propagation delay of the multiplexer.

The codes stored in the memories 25 and 26 are successively retrieved and converted into the output code of the encoder. Generally, the encoder includes a means for providing a first portion of the output code in response to the LSBs of the MSBs. In the FIG. 2 embodiment, there is only one section which is more significant than LSBs, i.e. MSBs. Consequently, the MSBs have one LSB. Therefore, the LSB of the MSBs retrieved from the segment memory 25 is the first portion of the output code, wherein a segment decoder is superfluous. The offset decoder 28 converts the selected codes stored in the offset memory 26 into a second portion of the output code.

The output memory 29 is used for interim storage of a plurality of the encoder output codes. The memory 29 can be significantly slower than the buffer memory consisting of the memories 25 and 26. The purpose thereof is to store the codes with a maximum speed. Subsequently, the content of the buffer memory can be transferred to the output memory at much lower speed. A random access memory (RAM) can be employed as the output memory 29.

The multiplexer includes a plurality of buffer means for separately receiving the section codes. Specifically, the buffers 21 and 22 receive the MSBs and LSBs respectively. The buffers 21 and 22 have open collector or open emitter outputs which are coupled in parallel for providing the selected code. One of the buffers also includes pull-up or pull-down resistors respectively for biasing the outputs.

The buffer 22 has an equal number of inputs and outputs. The buffer 21 has one more input than has outputs. Specifically, the LSB of the MSBs is applied to a separate input of the buffer 21 for enabling the outputs thereof. The LSBs received by the buffer 22 appear at the outputs thereof if the outputs of the buffer 21 are disabled. Otherwise, by nature of the thermometer code which is the encoder input code, a portion of the MSBs excluding the LSB thereof appears at the outputs. By these means, either the LSBs or MSBs excluding the respective LSB are provided as the selected code by the buffers 21 and 22.

The operation of the encoder will become more clear by analyzing an example of an encoder with memory for a 4-bit flash ADC. A comparator section thereof provides a 15-bit thermometer code. For simplicity, the encoder input code, i.e. the thermometer code, is divided into two section. These sections are MSBs and LSBs of the input code. The number of input and output terminals of the components is equal to the respective numbers of bits.

For instance, if the input code is equal 00000000 0011111, the MSBs and LSBs are equal 00000000 and 0011111 respectively. The LSB of the MSBs is equal 0, whereby the buffer 21 is disabled. Consequently, the selected code appearing at the outputs of the buffer 21 and 22 is equal 0011111. The LSB of the MSBs is stored in the segment memory 25 and subsequently provided as first portion of the output code. The selected code is stored in the offset memory 26 and subsequently converted by the offset decoder 28 into the second portion of the output code equal 101. The output code is equal 0101 which is the binary representation of the 15-bit thermometer code.

In another example, the input code is equal 00000011 1111111. The MSBs and LSBs are equal 00000011 and 1111111 respectively. The LSB of the MSBs is equal 1, whereby buffer 21 is enabled. Consequently, the selected code provided by the outputs of the buffer 21 and 22 is equal 0000001 which is the portion of the MSBs excluding the LSB thereof. The selected code is stored and subsequently converted into the second portion of the output code equal 001. The output code is equal 1001.

The buffers 21 and 22 have open collector outputs and are coupled in parallel so that AND function is performed. Open collector outputs are characteristic of transistor-transistor logic (TTL) and logic disclosed in the abovementioned "Ultra Fast Logic" Ser. No. 180,431 filed Apr. 12, 1988, by the same inventor. Also open emitter outputs can be used, whereby OR function is performed. However, it is necessary to obtain inverted input code. This can be performed by comparators of the flash ADC or buffers 21 and 22. Open emitter outputs are characteristic of emitter-coupled logic (ECL).

The encoder according to the present invention has an extended error correction scheme. The thermometer code is anomalous if one or more bits thereof are false. If the LSB of the MSBs is correct and any other bit false, the correction is accomplished by the offset decoder 28. If the LSB of the MSBs is false, the output code is equal 0111 or 1000 depending on the value of the LSB. A complete error correction can be accomplished by an encoder disclosed in the abovementioned "Encoder for Flash Analog-to-Digital Converters" Ser. No. 225,240 filed Jul. 28, 1988, by the same inventor.

The division of the input code into two section codes results in 1-bit segment memory 25 and 7-bit offset memory 26, i.e. 8-bit buffer memory. The encoder provides 4-bit output code. Therefore, the buffer memory requires double capacity in comparison with a memory coupled in a conventional manner. Specifically, the 4-bit output memory 29 is coupled for interim storage of the encoder output codes.

The capacity of the buffer memory can be substantially reduced by choosing a suitable partition of the input code. The following program written in BASIC determines the preferred partition. The resolution of the flash ADC coupled to the present encoder is equal N whose range is 4 to 16 bits. The preferred number of the section codes is equal PART. OFFS is the number of the LSBs of the encoder input code. Each more significant section code provides one LSB, wherein SEGM is the number of the respective LSBs. Consequently, SEGM-bit segment memory 25, or 15 in FIG. 1, and OFFS-bit offset memory 26, or 16 in FIG. 1, are employed. The program also determines how many times the capacity of the buffer memory is greater than the capacity of the output memory 29, i.e. ordinary memory coupled to the encoder output.

for N=4 to 16:for k%=N2 to N/2
PART=2 k%:SEGM=PART-1:OFFS=2 N-/PART-1
print N,SEGM,OFFS,(SEGM+OFFS)/N:next:next Preferred partitions have number of the section codes PART equal to a power of 2. Moreover, the least significant section code, i.e. the LSBs of the input code, has one bit less than each more significant section code has. In particular, for the resolution N equal 4 the preferred number of the section codes is 4 rather than 2 as in the first numerical example. The capacity of the buffer memory is 1.5 times higher than of the output memory 29. For N equal 8 the preferred number of the section codes is 16. The capacity of the buffer memory is 3.75 times higher than of the output memory 29. If N is an odd number, two different partitions result in even capacity of the buffer memory. The partition whose SEGM is greater than OFFS results in a simpler structure of buffers such as 21 and 22. For instance, the input code equal 00000000 0011111, considered in the first numerical example, is divided into the LSBs equal 111 and more significant section codes equal 0000, 0000 and 0011. The LSBs of these section codes are equal 0, 0 and 1 respectively. A buffer, such as 21, receiving the LSB equal 1 is enabled, whereby the selected code is equal 001. The selected code is the portion of the code equal 0011, excluding the LSB thereof. The LSBs of the more significant section codes result in the code equal 001. This code is stored and subsequently converted into the first portion of the output code equal 01. The selected code is stored and subsequently converted into the second portion of the output code equal 01. The encoder output code is equal 0101 and is the same as in the first numerical example.

The other input code considered in the previous numerical example was equal 00000011 1111111. Dividing this code into 4 section codes results in the LSBs of the input code equal 111 and more significant section codes equal 0000, 0011 and 1111. The LSBs of these section codes are equal 0, 1 and 1 respectively. Two buffers receiving the LSBs equal 1 are enabled. The selected code is equal 001 due to the AND function performed at the buffer outputs. The LSBs of the more significant section codes result in the code equal 011. This code is stored and subsequently converted into the first portion of the output code equal 10. The selected code is stored and subsequently converted into the second portion of the output code equal 01. The encoder output code is equal 1001 and is the same as in the previous numerical example.

The segment decoder, 17 in FIG. 1, and offset decoders, 18 and 28 in FIGS. 1 and 2 respectively, include priority encoders. The codes applied thereto have LSBs which are equal 1. A priority encoder outputs a binary number which corresponds to the position of 1 having the highest weight. An example of such an encoder is disclosed by Clark et al. in the abovementioned "Converter for Converting a High Frequency Video Signal to a Digital Signal" U.S. Pat. No. 4,211,999 dated Jul. 8, 1980. However, the segment and offset decoders of the present invention can use more complex conversion scheme to correct possible errors, as pointed out hereinabove. In particular, read only memories (ROMs) may be used as to accomplish a suitable error correction.

The employment of the buffer memory makes possible a significantly faster processing of the input codes and thus the operation of the flash ADC including the present encoder. Specifically, a simple multiplexing is performed to supply the offset memory 26. The segment memory 25 is coupled in series with the buffer 23 which compensates for a propagation delay of the multiplexer. An input register is unnecessary. An additional processing is required by the offset decoder 28 prior to storage in the output memory 29. The division of the MSBs into a plurality of section codes requires the segment decoder such as 17 of FIG. 1. The decoders may have substantial propagation delays.

Figure 3:
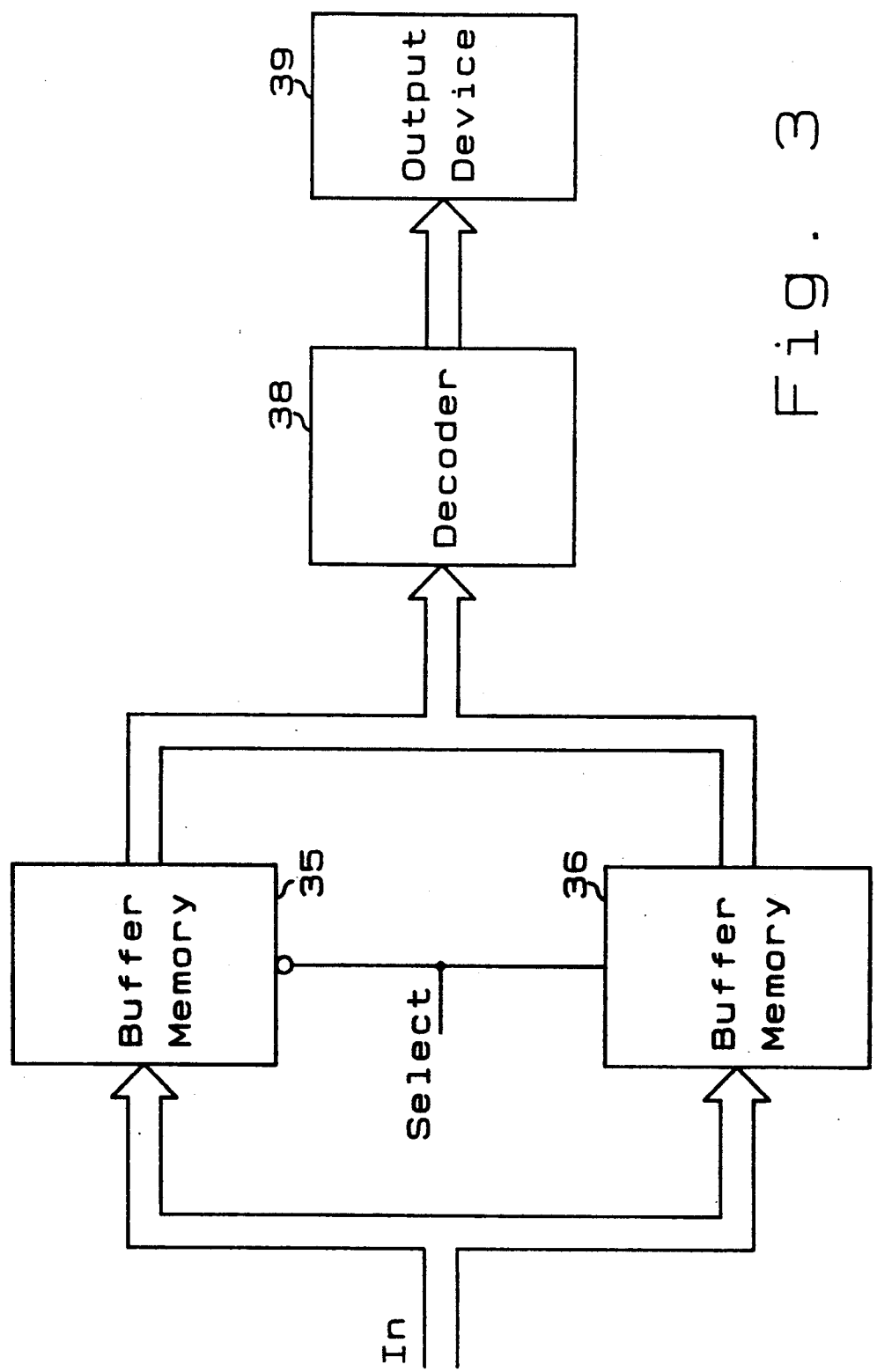
FIG. 3 is an embodiment of an output stage of the encoder including buffer memories for storing and retrieving data simultaneously.

FIG. 3 is an embodiment of an output stage of the encoder including buffer memories for storing and retrieving data simultaneously. The buffer memories 35 and 36 are used for interim storage of a plurality of LSBs of more significant codes and a plurality of the selected codes. In particular, a multiplexer, such as 14 of FIG. 1 or one consisting of buffers 21 and 22 of FIG. 2, can provide the selected codes to memories 35 and 36. Each of the buffer memories 35 and 36 represents the memories 15 and 16 of FIG. 1 or 25 and 26 of FIG. 2.

The inputs of the buffer memories 35 and 36 are coupled in parallel. Moreover, the outputs thereof are coupled in parallel, similarly to buffers 21 and 22 of FIG. 2. The outputs may be 3-state, open collector or open emitter, so that the function of a multiplexer is performed. Specifically, a signal is applied to the select input so that one memory is being written while outputs thereof are disabled. The content of the other memory is simultaneously read. In particular, the outputs thereof are enabled. The codes stored in the other memory are successively applied to and converted by the decoder 38 into binary codes. The binary codes are further processed by the output device 39.

The decoder 38 corresponds to the decoders 17, 18 of FIG. 1 and 28 of FIG. 2. For instance, the decoder 38 may comprise a pair of separately operating priority encoders. The output device 39 may be a microprocessor based system, e.g. digital storage oscilloscope, and also perform the function of the decoder 38. The capacity of the buffer memories 35 and 36 depends on the speed with which the contents thereof are retrieved. The output device 39 requires a minimal memory as the binary codes successively provided by the decoder 38 can be processed immediately.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Encoder for converting input code into output code, comprising:

a means for dividing the input code into a least significant section code and at least one more significant section code each having a least significant bit;

a means for providing a first portion of the output code in response to the least significant bits;

a multiplexer means for selecting one section code or a portion thereof excluding the respective least significant bit, in response to the least significant bits; and an offset decoder means for converting the selected code into a second portion of the output code.

2. Encoder of claim 1 wherein the means for dividing includes a register means for interim storage of the input code.

3. Encoder of claim 1 wherein the means for providing includes a buffer means for compensating for a propagation delay of the multiplexer means.

4. Encoder of claim 1 wherein the means for providing includes a segment decoder means for converting the least significant bits into the first portion of the output code.

5. Encoder of claim 4 wherein the segment decoder means includes a priority encoder.

6. Encoder of claim 1 wherein the offset decoder means includes a priority encoder.

7. Encoder of claim 1 wherein the multiplexer means includes a plurality of buffer means for separately receiving the section codes.

8. Encoder of claim 7 wherein the buffer means have outputs coupled in parallel for providing the selected code, and further wherein the outputs of the buffer means receiving the more significant section codes are enabled by the respective least significant bits.

9. Encoder of claim 1 further including a memory means for interim storage of a plurality of the least significant bits and a plurality of the selected codes.

10. Encoder of claim 9 wherein the first said memory means has an output, and further including:

a second memory means having an output, for interim storage of a plurality of the least significant bits and a plurality of the selected codes; and a second multiplexer means for selecting the output of the first said or second memory means.

11. Encoder of claim 1 further including a memory means for interim storage of a plurality of the output codes.

12. Encoder of claim 1 wherein each section code has a number of bits, further wherein the least significant section code has one bit less than each more significant section code has, and still further wherein the number of the section codes is equal to a power of two.

13. Encoder for converting input code into output code, comprising:

a means for dividing the input code into a least significant section code, and a plurality of more significant section codes each having a least significant bit;

a multiplexer means for selecting the least significant section code or a portion of one of the more significant section codes excluding the least significant bit thereof, in response to the least significant bits; and a decoder means for converting the least significant bits and selected code into the output code.

14. Encoder of claim 13 wherein the means for dividing includes a register means for interim storage of the input code.

15. Encoder of claim 13 wherein the multiplexer means includes a plurality of buffer means for separately receiving the section codes and having outputs coupled in parallel for providing the selected code, and further wherein the outputs of the buffer means receiving the more significant section codes are enabled by the respective least significant bits.

16. Encoder of claim 13 further including a buffer means coupled in series with the least significant bits for compensating for a propagation delay of the multiplexer means.

17. Encoder of claim 13 further including a memory means for interim storage of a plurality of the least significant bits and a plurality of the selected codes.

18. Encoder of claim 17 wherein the first said memory means has an output, and further including:

a second memory means having an output, for interim storage of a plurality of the least significant bits and a plurality of the selected codes; and a second multiplexer means for selecting the output of the first said or second memory means.

19. Encoder of claim 13 further including a memory means for interim storage of a plurality of the output codes.

20. Encoder of claim 13 wherein each section code has a number of bits, further wherein the least significant section code has one bit less than each more significant section code has, and still further wherein the number of the section codes is equal to a power of two.

* * * * *